US009014652B2

(12) United States Patent
Bakalski

(10) Patent No.: US 9,014,652 B2
(45) Date of Patent: Apr. 21, 2015

(54) MOBILE COMMUNICATION DEVICE

(75) Inventor: Winfried Bakalski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 251 days.

(21) Appl. No.: 13/530,973

(22) Filed: Jun. 22, 2012

(65) Prior Publication Data
US 2013/0344835 A1 Dec. 26, 2013

(51) Int. Cl.
*H04B 1/10* (2006.01)
*H03H 7/01* (2006.01)

(52) U.S. Cl.
CPC ........... *H03H 7/0115* (2013.01); *H03H 7/0153* (2013.01); *H03H 7/1758* (2013.01); *H03H 7/1766* (2013.01); *H03H 2210/025* (2013.01); *H03H 2210/036* (2013.01); *H03H 2250/00* (2013.01)

(58) Field of Classification Search
CPC ........ H03H 11/00; H03H 21/00; H03H 19/00
USPC .................... 333/103; 455/307, 226.1, 16, 17
See application file for complete search history.

(56) References Cited

U.S. PATENT DOCUMENTS

| 2002/0186757 | A1 | 12/2002 | Nakamura et al. |
| 2003/0143950 | A1* | 7/2003 | Maldonado ..................... 455/17 |
| 2004/0239442 | A1 | 12/2004 | Wilcox |
| 2005/0105004 | A1* | 5/2005 | Van Der Wijst et al. ...... 348/571 |
| 2006/0232358 | A1* | 10/2006 | Jedeloo ......................... 333/103 |
| 2006/0264174 | A1* | 11/2006 | Moss .............................. 455/16 |
| 2008/0194221 | A1* | 8/2008 | Uramoto et al. ........... 455/226.1 |
| 2010/0323651 | A1 | 12/2010 | Ranjan |

FOREIGN PATENT DOCUMENTS

| CN | 1372427 A | 10/2002 |
| CN | 1795617 A | 6/2006 |

* cited by examiner

*Primary Examiner* — Wesley Kim
*Assistant Examiner* — Raj Chakraborty
(74) *Attorney, Agent, or Firm* — Slater & Matsil, L.L.P.

(57) ABSTRACT

Embodiments provide a mobile communication device comprising an adaptive filter for filtering a RF signal and a controller. The adaptive filter comprises a first terminal, a second terminal, a reference terminal for providing a reference potential, a first filter structure connected in series between the first terminal and the second terminal, a second filter structure connected in series between the first terminal and the reference terminal, and a third filter structure connected in series between the second terminal and the reference terminal, wherein at least one filter structure of the first, second and third filter structures comprises at least one switchable filter element. The controller is configured to selectively activate or deactivate the at least one switchable filter element based on the RF signal or a baseband version thereof.

22 Claims, 15 Drawing Sheets

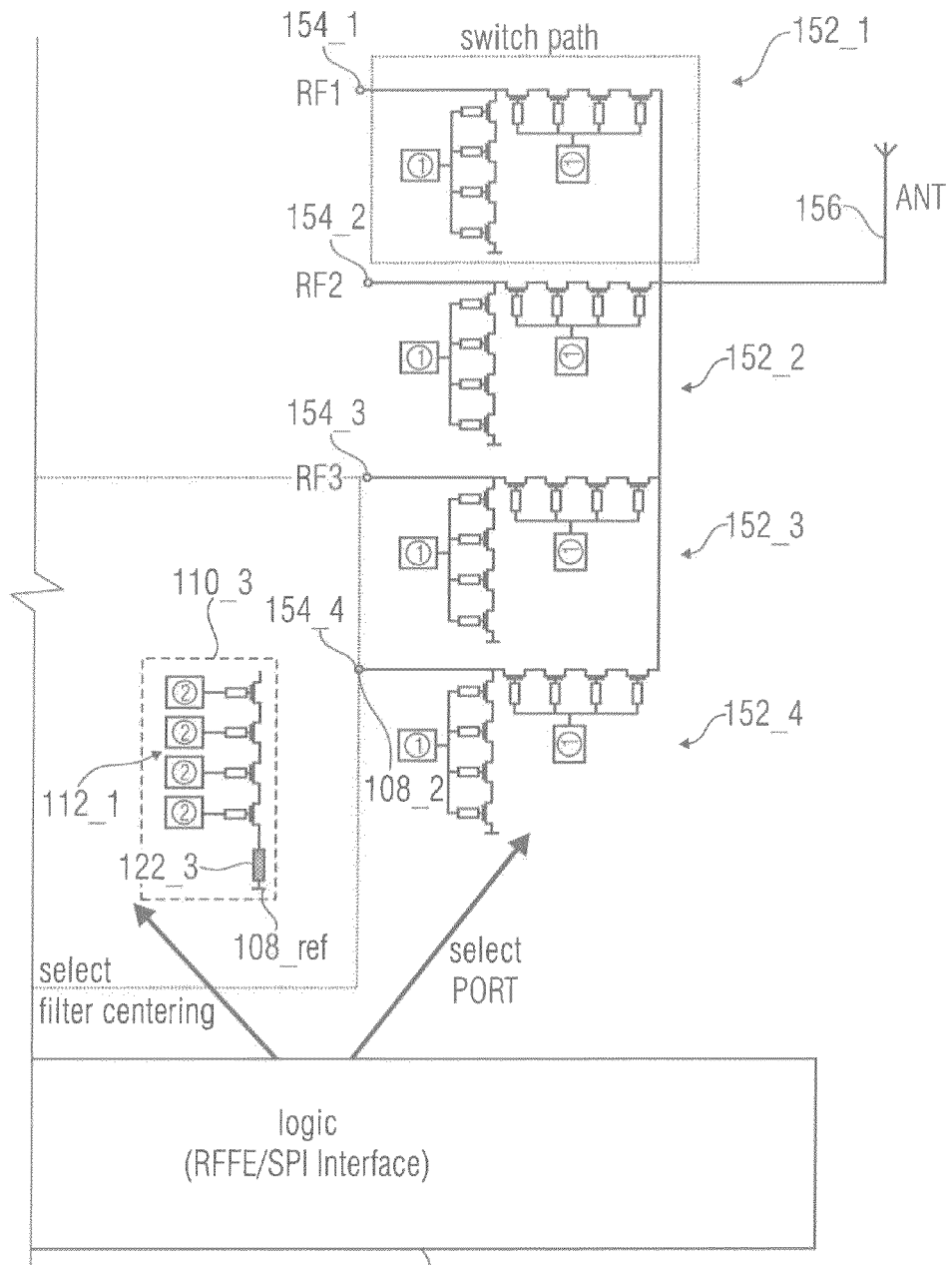

MOBILE COMMUNICATION DEVICE

TECHNICAL FIELD

Embodiments relate to a mobile communication device. Some embodiments relate to a mobile communication device with an adaptive filter. Some embodiments relate to a configurable filter RF frontend module.

BACKGROUND

Mobile communication devices can be used for voice and/or data communication with other mobile communication devices and/or a mobile communication base stations.

SUMMARY OF THE INVENTION

Embodiments provide a mobile communication device comprising an adaptive filter for filtering a RF signal, and a controller. The adaptive filter comprises a first terminal, a second terminal, a reference terminal configured to provide a reference potential, a first filter structure connected in series between the first terminal and the second terminal, a second filter structure connected in series between the first terminal and the reference terminal, and a third filter structure connected in series between the second terminal and the reference terminal, wherein at least one of the first, second or third filter structure comprises at least one switchable filter element. The controller is configured to selectively activate or deactivate the at least one switchable filter element based on the RF signal or a baseband version thereof.

Further embodiments provide a mobile communication device comprising an adaptive filter for filtering a RF signal, and a RF switch. The adaptive filter comprises a first terminal, a second terminal, a reference terminal for providing a reference potential, a first filter structure connected in series between the first terminal and the second terminal, a second filter structure connected in series between the first terminal and the reference terminal, and a third filter structure connected in series between the second terminal and the reference terminal, wherein each filter structure of the first, second and third filter structures comprises at least one switchable filter element. The RF switch comprises a RF switch logic and a plurality of RF switch paths having a plurality of RF switch ports, wherein the adaptive filter is connected to one RF switch port of the plurality of RF switch ports, wherein the RF switch logic is configured for selectively switching at least one of the plurality of RF switch ports by means of the plurality of RF switch paths to an antenna of the mobile communication device and to selectively activate or deactivate the at least one switchable filter element based on the RF signal or a baseband version thereof.

Further embodiments provide a method for adaptive filtering a RF signal in a mobile communication device with an adaptive filter. The adaptive filter comprises a first terminal, a second terminal, a reference terminal for providing a reference potential, a first filter structure connected in series between the first terminal and the second terminal, a second filter structure connected in series between the first terminal and the reference terminal, and a third filter structure connected in series between the second terminal and the reference terminal, wherein at least one of the first, second or third filter structure comprises at least one switchable filter element. The method comprise the step of selectively activating or deactivating the at least one switchable filter element based on the RF signal or a baseband version thereof.

BRIEF DESCRIPTION OF THE DRAWINGS

Embodiments of the present invention are described herein making reference to the appended drawings.

Figure 1:
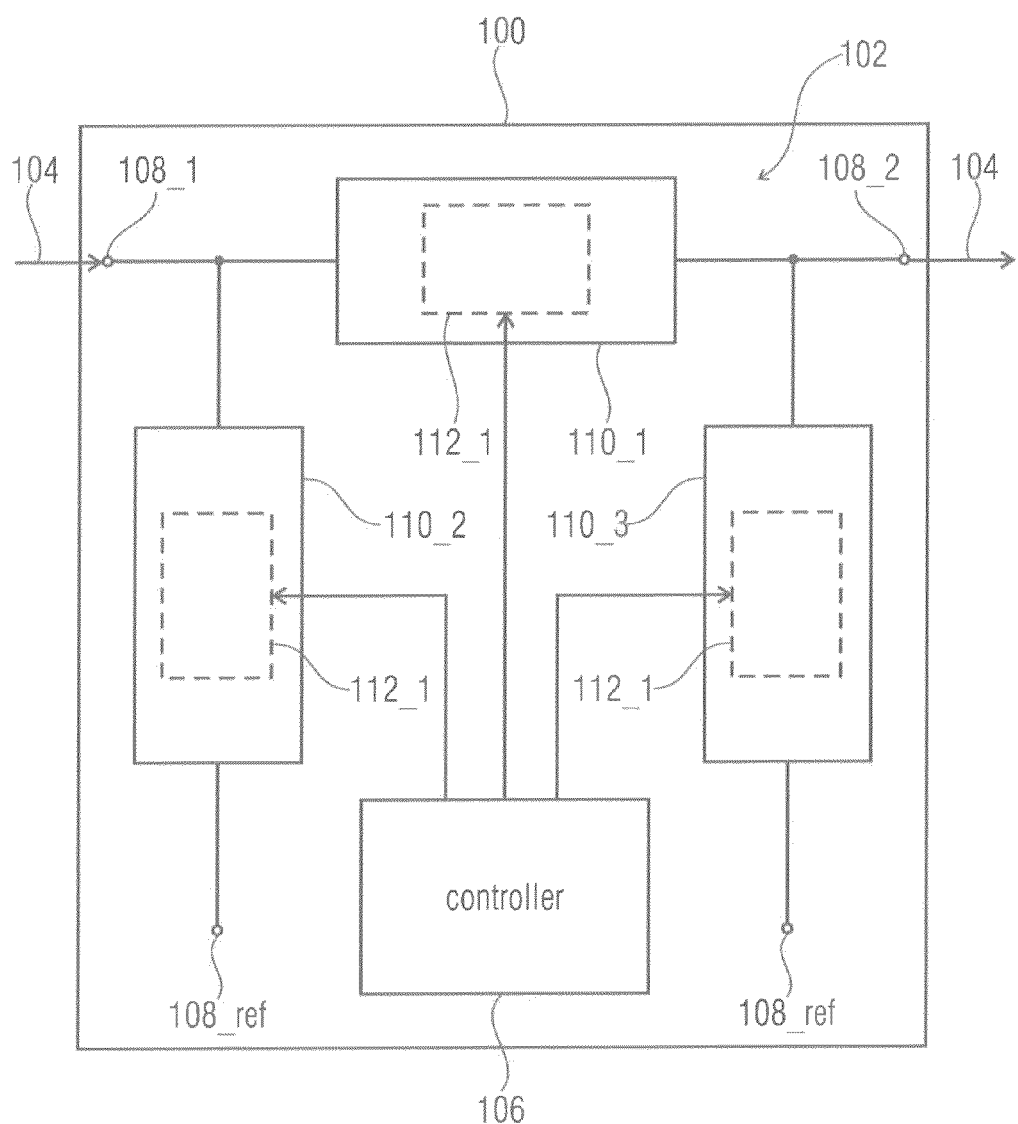
FIG. 1 shows a block diagram of a mobile communication device according to an embodiment.

Equal or equivalent elements or elements with equal or equivalent functionality are denoted in the following description by equal or equivalent reference numerals.

DETAILED DESCRIPTION OF ILLUSTRATIVE EMBODIMENTS

In the following description, a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

FIG. 1 shows a block diagram of a mobile communication device 100 according to an embodiment. The mobile communication device 100 comprises an adaptive filter 102 for filtering a RF signal 104, and a controller 106. The adaptive filter 102 comprises a first terminal 108_1, a second terminal 108_2, a reference terminal 108_ref for providing a reference potential, a first filter structure 110_1 connected in series between the first terminal 108_1 and the second terminal 108_2, a second filter structure 110_2 connected in series between the first terminal 104_1 and the reference terminal 108_ref, and a third filter structure 110_3 connected in series between the second terminal 108_2 and the reference terminal 108_ref, wherein at least one filter structure of the first, second or third filter structures 110_1 to 110_3 comprises at least one switchable filter element 112_$n$ (n=1). The controller 106 is configured to selectively activate or deactivate the at least one switchable filter element 112_$n$ (n=1) based on the RF signal or a baseband version thereof.

In some embodiments, the adaptive filter 102 can be adapted to a specific frequency or frequency range, or to filter a specific frequency or frequency range by the controller 106 by selectively activating or deactivating the at least one switchable filter element 112_$n$ (n=1).

For example, in some embodiments, the at least one switchable filter element 112_$n$ (n=1) can be configured to provide a first capacitance in the activated state (or in response to the activated state, or in response to the selective activation by the controller 106) and a second capacitance different from the first capacitance in the deactivated state (or in response to the deactivated state, or in response to the selective deactivation by the controller 106). Moreover, the at least one switchable filter element 112_$n$ (n=1) can be configured to provide a first inductance in the activated state and a second inductance different from the first inductance in the deactivated state.

As already mentioned, at least one filter structure of the first, second and third filter structures 110_1 to 110_3 can comprise at least one switchable filter element 112_$n$. Thereby, n is a natural number greater than or equal to one (n≥1). For example, the first filter structure 110_1 can comprise 1, 2, 3, 4, 5, 10, or even 20 switchable filter elements 112_$n$. Naturally, also the second filter structure 110_2 or the third filter structure 110_3 can comprise 1, 2, 3, 4, 5, 10, or even 20 switchable filter elements 112_$n$.

As indicated in FIG. 1 by way of example, in some embodiments, each filter structure of the first, second and third filter structures 110_1 to 110_2 can comprise at least one switchable filter element 112_$n$. Thereby, the first, second and third filter structures 110_1 to 110_3 do not necessarily have to comprise the same number of switchable filter elements 112_$n$. For example, the first filter structure 110_1 can comprise 4 switchable filter elements 112_$n$ (n=4), wherein the second filter structure 110_2 can comprise 6 switchable filter elements 112_$n$ (n=6), and wherein the third filter structure can comprise 5 switchable filter elements 112_$n$ (n=5). Naturally, the adaptive filter 102 can also comprise any other combination of numbers of switchable filter elements 112_$n$.

The adaptive filter 102 can be a harmonics filter 102, e.g., of a frontend module of a mobile communication device 100.

Furthermore, the adaptive filter 102 can be configured to filter the RF signal 104 in order to obtain a filtered RF signal 114.

The mobile communication device 100 can be a portable mobile communication device 100. For example, the mobile communication device 100 can be configured to perform a voice and/or data communication (e.g., according to a mobile communication standard) with another (portable) mobile communication device and/or a mobile communication base station. Such a mobile communication device 100 can be, for example, a mobile headset such as a mobile phone (or cell phone), a so called smart phone, a tablet PC, a broadband modem, a notebook or a laptop, as well as a router or a personal computer.

Figure 2:
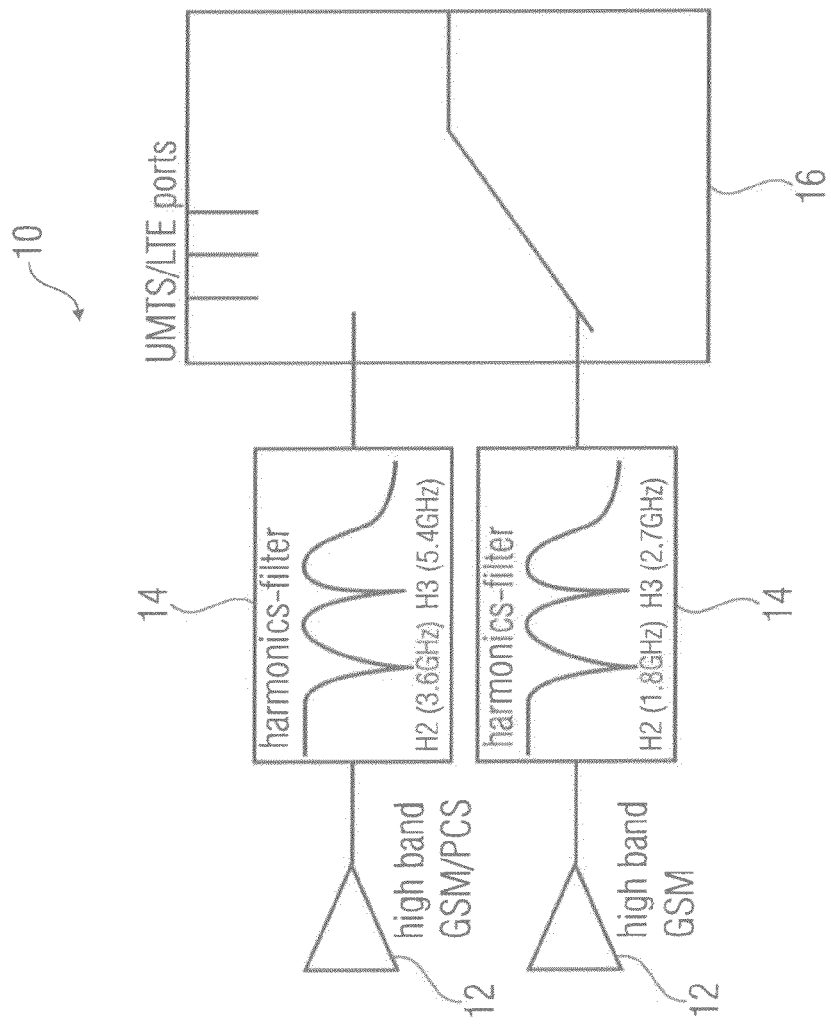
FIG. 2 shows a block diagram of a conventional frontend module of a mobile communication device.

FIG. 2 shows a block diagram of a conventional frontend module 10 of a mobile communication device. The frontend module 10 comprises power amplifiers 12, harmonics filters 14 and a RF switch 16.

As shown in FIG. 2, a power amplifier 12 and a harmonics filter 14 is assigned in dependence on the frequency range to each GSM mode (GSM=Global System for Mobile Communications). Reason therefor is the higher power output of the power amplifiers in the GSM case. For example, the average power output amounts to approx. 35 dBm in case of GSM LB (LB=low band) and to approx. 33 dBm in case of GSM HB (HB=high band) in contrast to the average power output which amounts to approx. 27 dBm in case of UMTS and/or LTE (UMTS=Universal Mobile Telecommunications System; LTE=Long Term Evolution). Hence, the filter must be realized steep in order to keep the losses small, i.e. the topmost frequency edge should have small losses, while the second harmonic at the lowermost edge should comprise a high degree of suppression. Thus, the filter design is a tradeoff between in-band losses and suppression.

Figure 3:
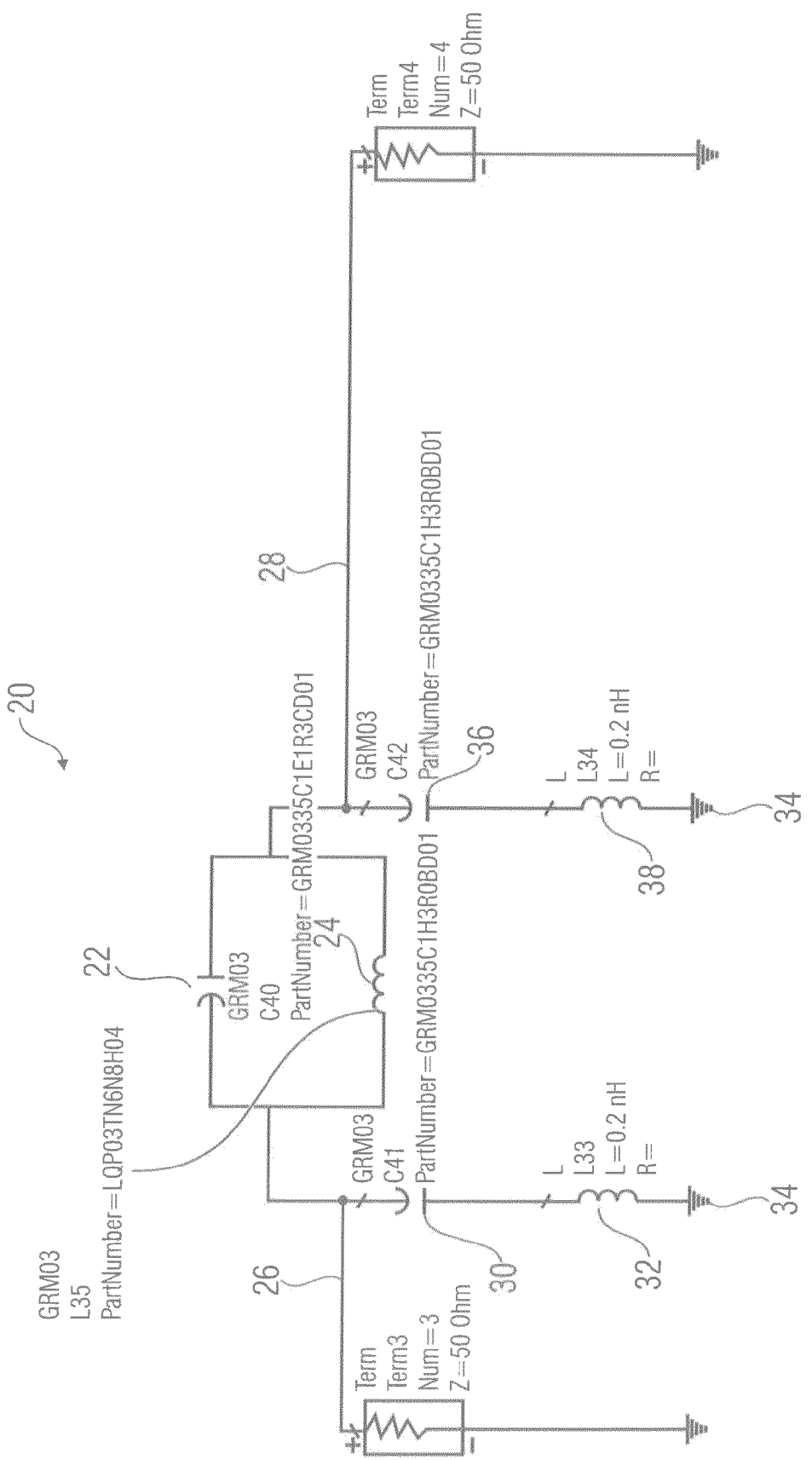
FIG. 3 shows a schematic diagram of a conventional harmonics filter.

FIG. 3 shows a schematic diagram of a conventional harmonics filter 20 designed for having a suppression of 20 dB. The harmonics filter 20 comprises a capacitor 22 and an inductor 24 connected in parallel between an input terminal 26 and an output terminal 28. Furthermore, the harmonics filter 20 comprises a capacitor 30 and an inductor 32 connected in series between the input terminal 26 and a ground terminal 34. In addition, the harmonics filter 20 comprises a capacitor 36 and an inductor 38 connected in series between the output terminal 28 and the ground terminal 34.

Figure 4:
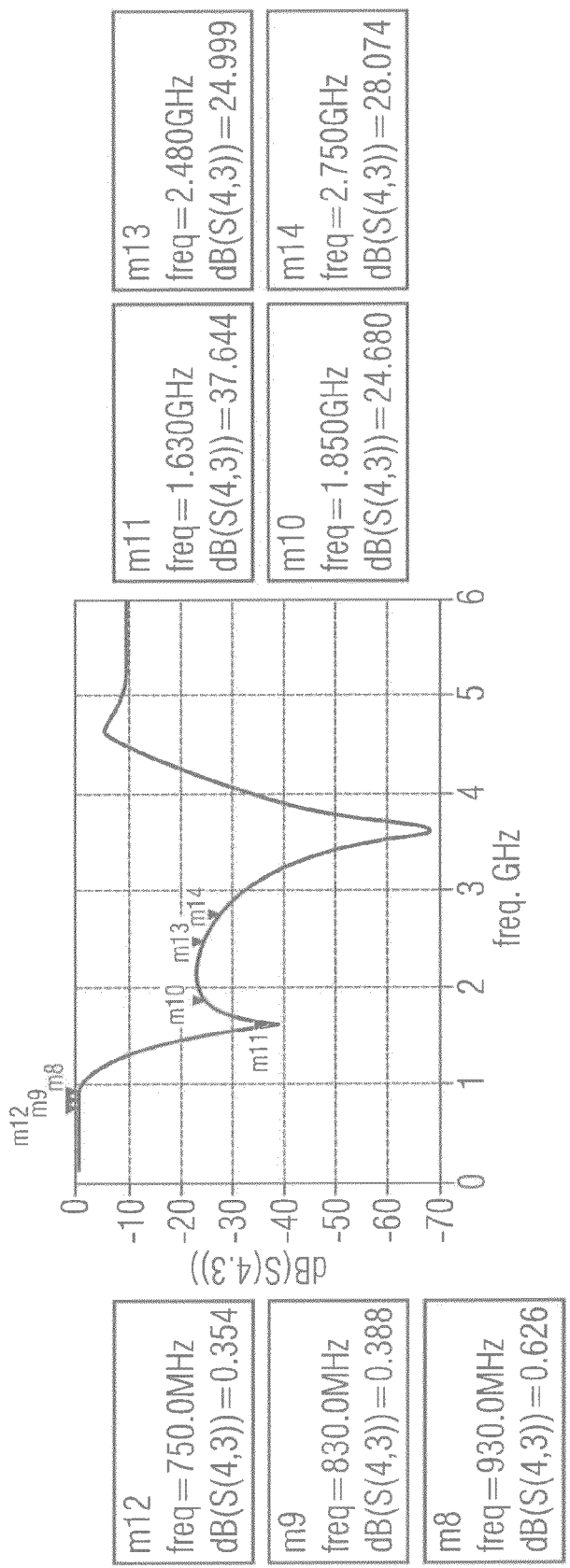
FIG. 4 shows a diagram of a transfer function of the conventional harmonics filter shown in FIG. 3.

FIG. 4 shows a diagram of a transfer function of the conventional harmonics filter 20 shown in FIG. 3. Thereby, the ordinate denotes the amplitude in dB and the abscissa the frequency in GHz.

As shown in FIG. 4, the losses already start to increase at 900 MHz, wherein the notches are located at 3.8 GHz. Note that the notches could be shifted towards lower frequencies. Nevertheless, this would lead to an additional degradation of input reflections and hence to an increased pass band loss.

For the above application, commonly, a module is used that comprises either the filter components as SMDs (SMD=surface mounted device) soldered in a laminate or as an extra module using IPDs (IPD=integrated passive device). A further integration step would involve an integration of the filter into the chip or tapping the filter structure in the ceramic, e.g., LTCC (LTCC=low temperature co-fired ceramic). However, this would require passive components having a higher quality (e.g., copper metallization) and more accurate tolerances.

Figure 5:
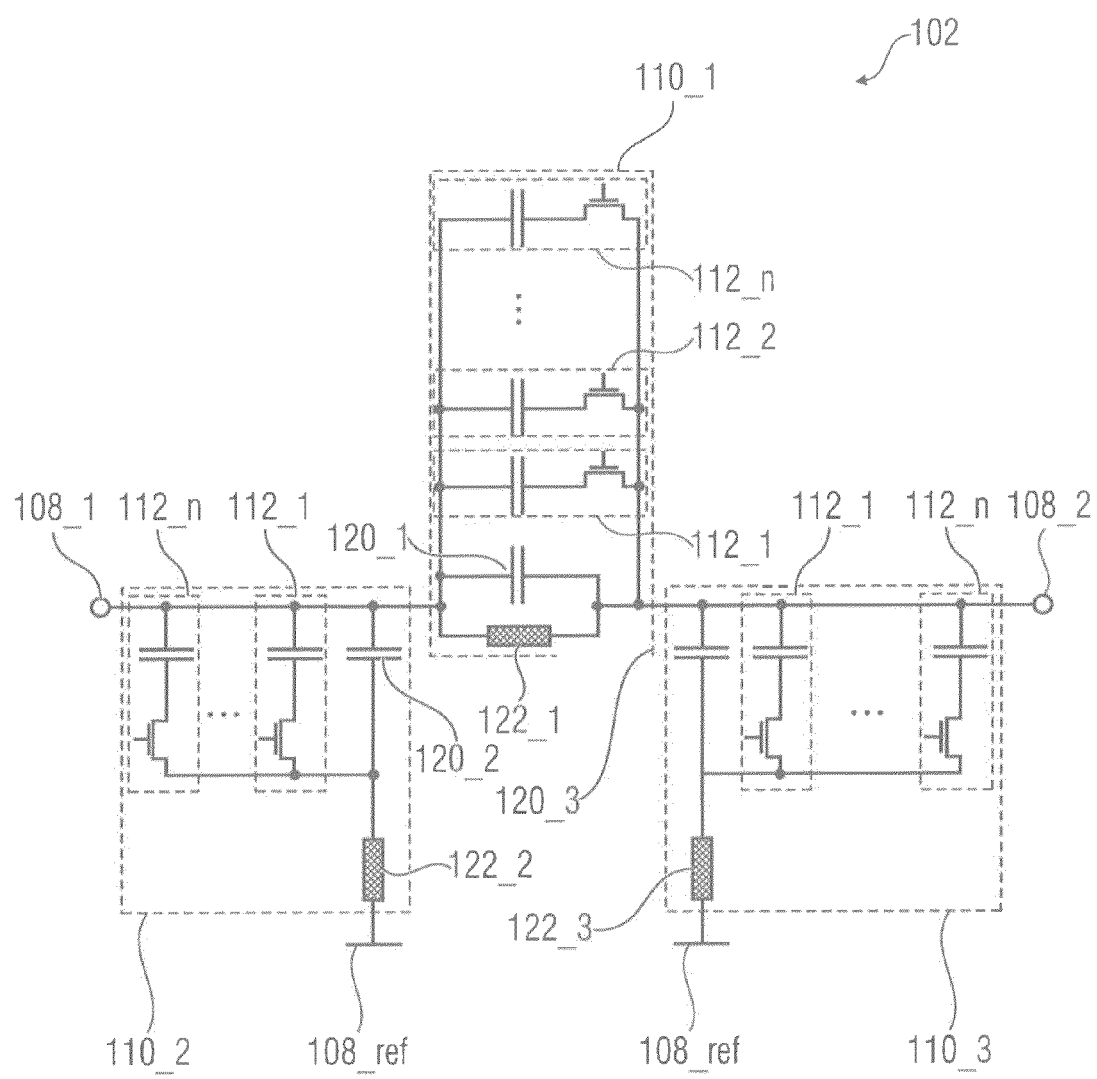
FIG. 5 shows a block diagram of an adaptive filter according to an embodiment.

FIG. 5 shows a block diagram of an adaptive filter 102 according to an embodiment. The adaptive filter 102 comprises a first terminal 108_1 (e.g., an input terminal), a second terminal 108_2 (e.g., an output terminal), a reference terminal 108_ref (e.g., a ground terminal) for providing a reference potential (e.g., ground potential), a first filter structure 110_1 connected in series between the first terminal 108_1 and the second terminal 108_2, a second filter structure 110_2 connected in series between the first terminal 108_1 and the reference terminal 108_ref, and a third filter structure 110_3 connected in series between the second terminal 108_2 and the reference terminal 108_ref. Thereby, at least one filter structure of the first, second and third filter structures 110_1 to 110_3 comprises at least one switchable filter element 112_$n$.

As shown in FIG. 5, in some embodiments, each filter structure of the first, second and third filter structures 110_1 to 110_3 can comprise n switchable filter elements. As already mentioned, n is a natural number greater than or equal to one (n≥1).

In some embodiments, the first filter structure 110_1 can comprise a first capacitive element 120_1 and a first inductive element 122_1 connected in parallel between the first terminal 108_1 and the second terminal 108_2. The second filter structure 110_2 can comprise a second capacitive element 120_1 and a second inductive element 122_2 connected in series between the first terminal 108_1 and the reference terminal 108_ref. The third filter structure 110_3 can comprise a third capacitive element 120_3 and a third inductive element 122_3 connected in series between the second terminal 108_2 and the reference terminal 108_ref. Thereby, at least one filter structure of the first, second and third filter structures 110_1 to 110_3 comprises the at least one switchable filter element 112__n_ such that the at least one switchable filter element 112__n_ is connected in parallel to at least capacitive element one of the first, second and third capacitive elements 120_1 to 120_3.

The at least one switchable filter element 112__n_ can comprise a passive filter unit switchable between a capacitive state and a non-capacitive state, wherein the passive filter unit can be configured to be in the capacitive state in response to the active state of the at least one switchable filter element 112__n_ and to be in the non-capacitive state in response to the deactivated state of the at least one switchable filter element 112__n_.

As shown in FIG. 5 by way of example, the passive filter unit can be a switchable capacitor, e.g., realized as a capacitor and an (active) switch, e.g. a transistor.

In some embodiments, the adaptive filter 102 comprises a basic filter (first, second and third filter structures 110_1 to 110_3 without switchable filter elements 112__n_) that is adapted to cover (almost) perfectly the upmost frequency edge of the pass band. The switchable filter elements 112__n_, e.g., switchable capacitances or inductances, can be used to set or adjust the filter 102 towards or to lower frequencies. If the adaptive filter 102 and the RF switch (or antenna switch) are integrated in one module or unit, then the RF switch can be used at the same time to control the adaptive filter 102. Note that the adaptive filter 102 requires a high Q factor, where by selectively activating the switchable filter elements only the Q factor of the activated switchable filter elements is reduced. In addition, if only capacitances instead of inductances are switched, then the loss of Q factor is marginal.

Hence, in some embodiments, the adaptive filter 102 can be realized by a basic filter (first, second and third filter structures 110_1 to 110_3) and switchable capacitances. Moreover, an integration can be realized as a single chip or in combination with a ceramic or other wiring technologies (e.g., a laminate, LTCC or IPD) that allow adding wires in the filter area.

In embodiments, the tradeoff between insertion losses located in the pass band and suppression of harmonics can be reduced by applying switchable filter elements 112__n_. Moreover, if an information describing the transmit frequency can be obtained or extracted, e.g., from the base band, then the filter 102 can be adjusted to that frequency. For example, when using the SPI and/or RFFE (MIPI) bus (SPI=Serial Peripheral Interface; RFFE=radio frequency front end; MIPI=Mobile Industry Processor Interface), then in addition to the switch position (to which a frequency range is assigned or associated) a further refinement can be made, as will become clear from the following discussion.

Figure 6:
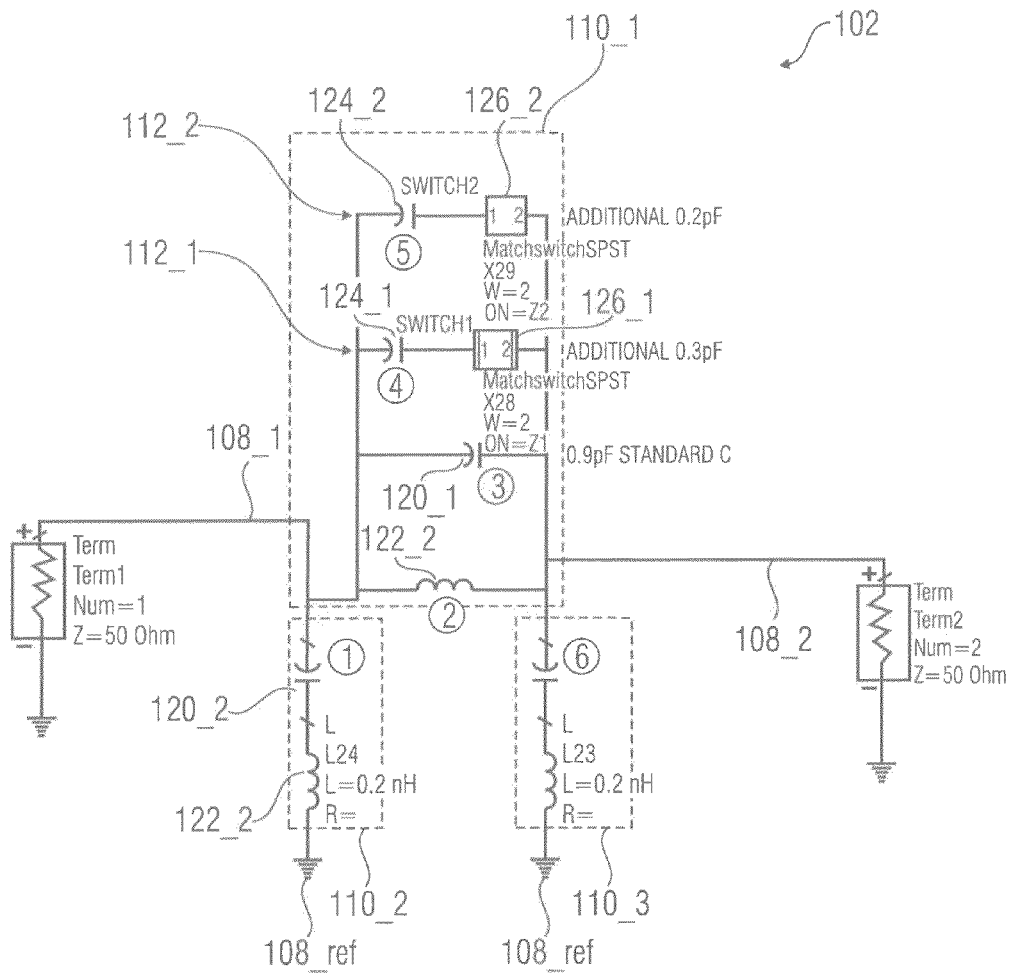
FIG. 6 shows a schematic diagram of an adaptive filter according to an embodiment.

FIG. 6 shows a schematic diagram of an adaptive filter 102 according to an embodiment. The adaptive filter 102 comprises a first terminal 108_1, a second terminal 108_2, a reference terminal 108_ref (e.g., ground terminal) configured to provide a reference potential (e.g., ground potential), a first filter structure 110_1 connected in series between the first terminal 108_1 and the second terminal 108_2, a second filter structure 110_2 connected in series between the first terminal 104_1 and the reference terminal 108_ref, and a third filter structure 110_3 connected in series between the second terminal 108_2 and the reference terminal 108_ref.

The first filter structure (in this example tuned for a H2 notch) 110_1 comprises a first capacitor 120_1 (e.g., having a capacitance of 0.9 pF) and a first inductor 122_1 (e.g., having an inductance of 6.8 nH for 900 MHz band) connected in parallel. Furthermore, the first filter structure 110_1 comprises a first switchable filter element 112_1 and a second switchable filter element 112_2. The first switchable filter element 112_1 comprises a first switchable capacitor (passive filter unit) implemented by a first capacitor 124_1 (e.g., having a capacitance of 0.3 pF) and a first switch 126_1. The second switchable filter element 112_2 comprises a second switchable capacitor (passive filter unit) implemented by a second capacitor 124_2 (e.g., having a capacitance of 0.2 pF) and a second switch 126_2.

The second filter structure 110_2 comprises a second capacitor 120_2 (e.g., having a capacitance of 2.4 pF tunes to higher edge of H3) and a second inductor 122_2 (e.g., having an inductance of 0.2 nH) connected in series. The third filter structure 110_3 comprises a third capacitor 120_3 (e.g., having a capacitance of 2.7 pF tunes to lower edge of H3) and a third inductor 122_3 (e.g., having an inductance of 0.2 nH) connected in series.

In other words, FIG. 6 shows by way of example a realization of the adaptive filter 102 with two switch positions. In that case, the resonance frequency of the series resonant circuit is shifted for the second harmonic H2 by means of adapting or varying the serial capacitance between 0.8 pF (first switch 126_1 and second switch 126_2 opened (being non-conductive)) to 1.3 pF (first switch 126_1 and second switch 126_2 closed (being conductive)).

For example, the serial inductor (first inductor 122_1 of the first filter structure 110_1) can comprise an inductance of 6.8 nH, wherein in a classical build up product the serial inductor may comprise an inductance of 5.8 nH, wherein it is a buried inductor having a relatively high capacitance, i.e. the inductor may be operated near its self-resonance, such that the value of the inductance may be slightly higher at the second harmonic H2. The other two resonant circuits (second and third filter structures 110_2 and 110_3) are slightly shifted from each other, such that the band width of the third harmonic can be addressed. As this is three times the fundamental frequency, e.g., 3×824 MHz-3×915 MHz, it results in a greater or increased band width. Note that the filter may be simplified, if the target frequency is known.

Figure 7A:
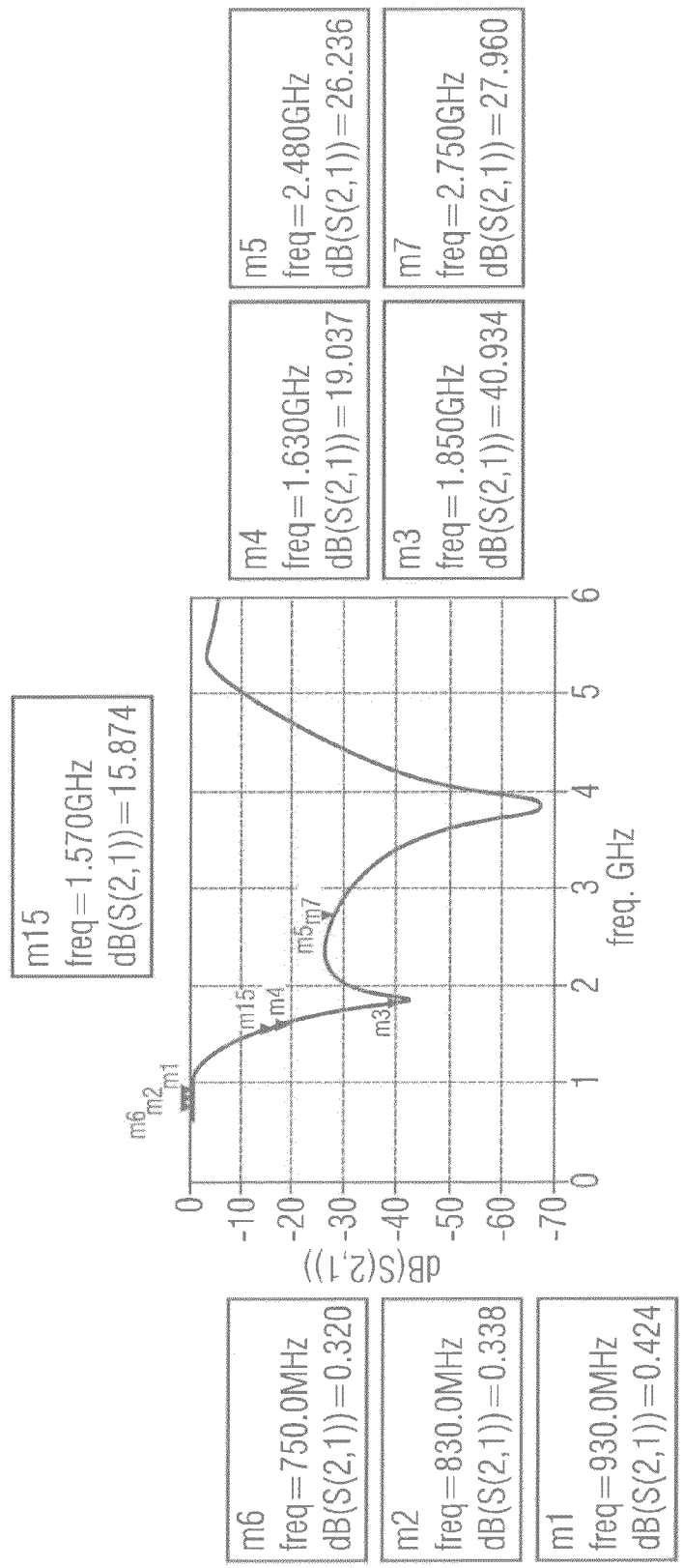
FIG. 7a shows a diagram of a transfer function of the adaptive filter shown in FIG. 6, wherein the first switch and the second switch are opened.

FIG. 7a shows a diagram of a transfer function of the adaptive filter 102 shown in FIG. 6, wherein the first switch 126_1 and the second switch 126_2 are opened (being non-conductive). Thereby, the ordinate denotes the amplitude in dB and the abscissa the frequency in GHz.

Figure 7B:
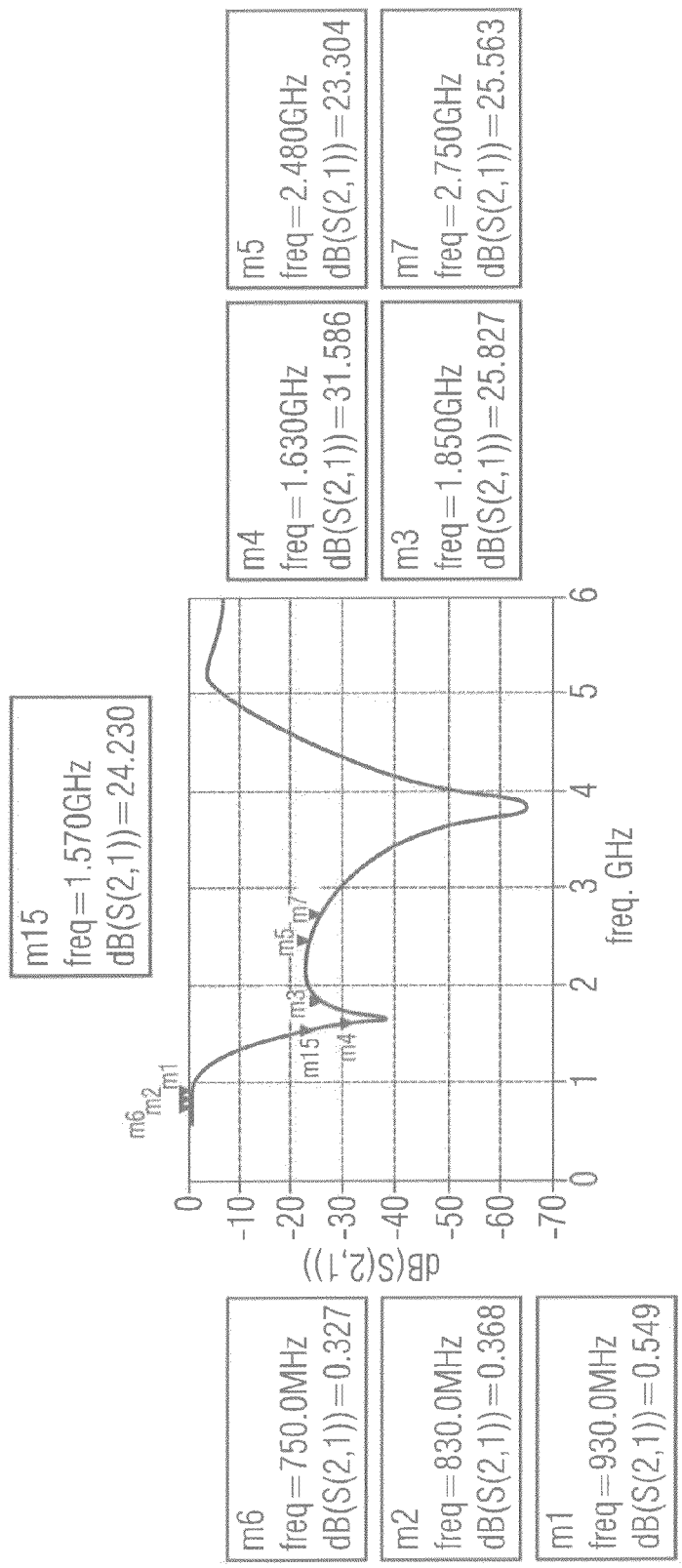
FIG. 7b shows a diagram of a transfer function of the adaptive filter shown in FIG. 6, wherein the first switch is closed and the second switch is opened.

FIG. 7b shows a diagram of a transfer function of the adaptive filter 102 shown in FIG. 6, wherein the first switch 126_1 is closed (being conductive) and the second switch 126_2 is opened (being non-conductive). Thereby, the ordinate denotes the amplitude in dB and the abscissa the frequency in GHz. In FIG. 7b, the capacitance of 0.3 pF of the first capacitor 124_1 is added to the total capacitance of the first filter structure 110_1.

Figure 7C:
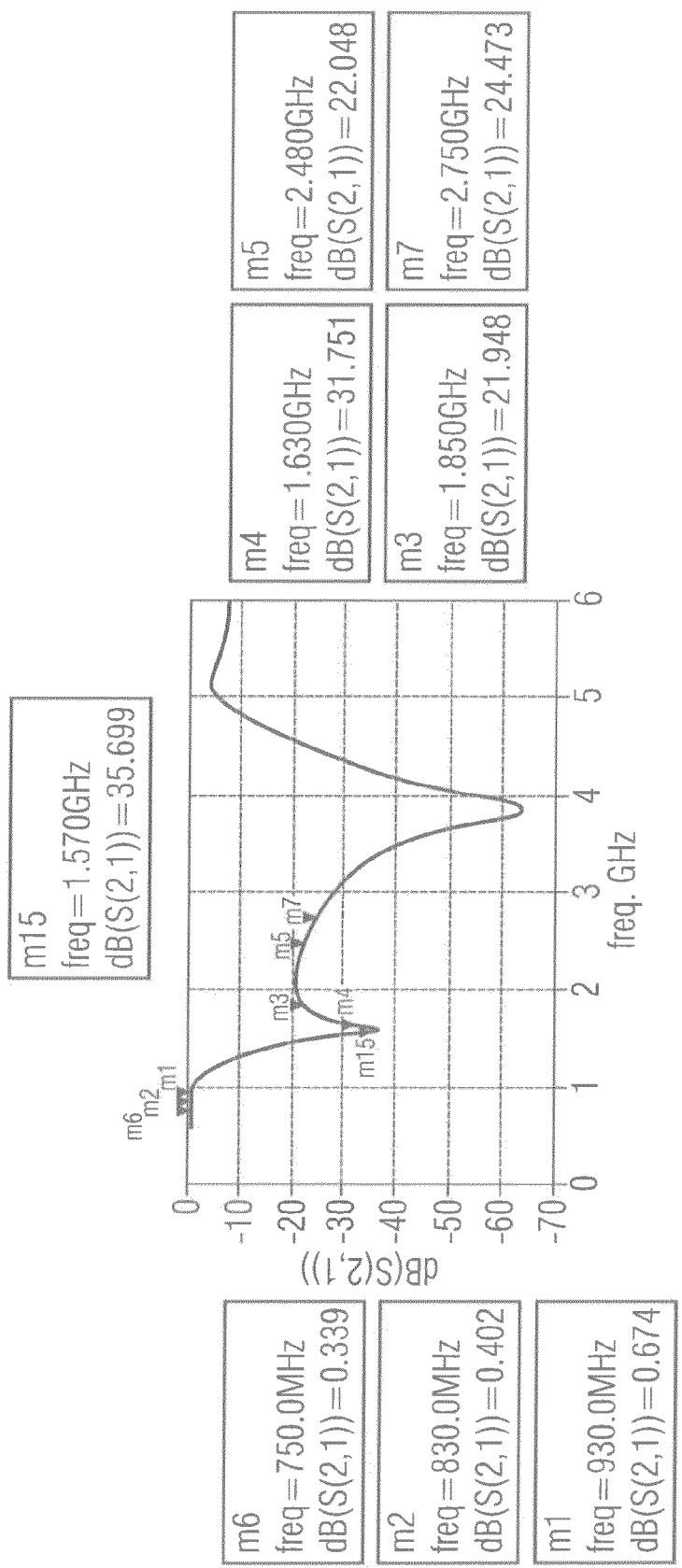
FIG. 7c shows a diagram of a transfer function of the adaptive filter shown in FIG. 6, wherein the first switch and the second switch are closed.

FIG. 7c shows a diagram of a transfer function of the adaptive filter 102 shown in FIG. 6, wherein the first switch 126_1 and the second switch 126_2 are closed (being conductive). Thereby, the ordinate denotes the amplitude in dB and the abscissa the frequency in GHz. In FIG. 7c, the capacitance of 0.3 pF of the first capacitor 124_1 and the capacitance of 0.2 pF of the second capacitor 124_2 are added to the total capacitance of the first filter structure 110_1. For example, as shown in FIG. 7c, the adaptive filter 102 can be adapted to the GSM Band 13 which is located at 768.5 MHz by means of the first and second switchable filter elements 112_1 and 112_2 such that the notch of the second harmonic H2 is located at 1.572 GHz.

As shown in FIGS. 7a to 7c, the notch of the second harmonic H2 can be shifted in its frequency such that the frequency at which the suppression comprises its maximum value can be selected. At the same time losses can be reduced. For example, the losses of the original filter amount to 0.63 dB, where the adaptive filter can be used to reduce or lower those losses by 0.2 dB.

Hence, the adaptive filter 102 comprises the following properties. First, the suppression of harmonics can be increased, for example, the original filter comprises a suppression of 25 dB for the second harmonic H2 which is located at 950 MHz, whereas the adaptive filter 102 comprises a suppression of 40 dB for the second harmonic H2. Second, insertion losses can be reduced.

In some embodiments, information describing the frequency used for transmission can be required for adjusting the adaptive filter 102. Nevertheless, nowadays the SPI and/or RFFE bus is used which allows to transmit this information as a frame or message to the antenna switch (RF switch) or module.

Figure 8A:
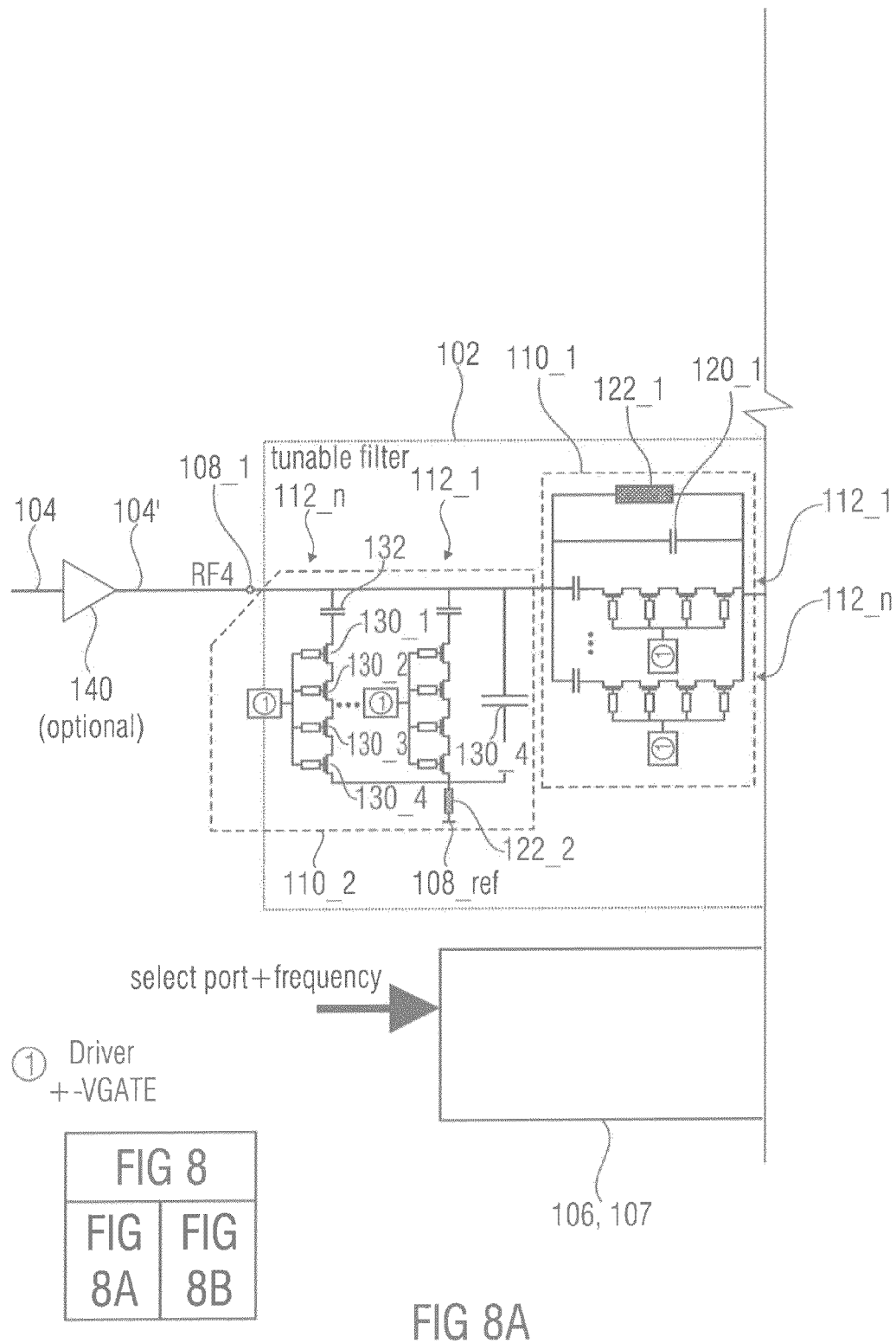
FIG. 8 shows a block diagram of a mobile communication device according to an embodiment.
Figure 8B:
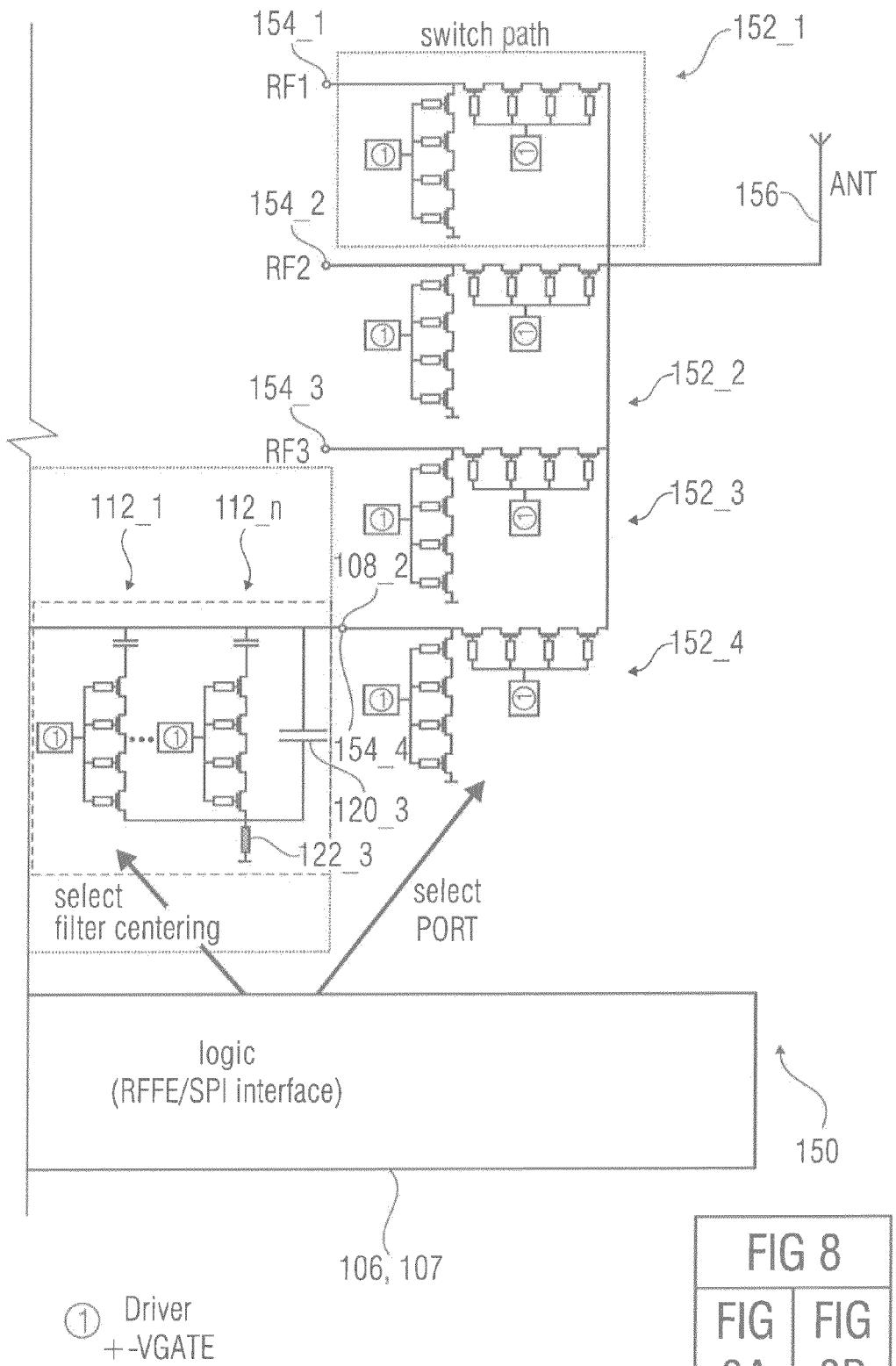

FIG. 8 shows a block diagram of a mobile communication device 100 according to an embodiment. The mobile communication device 100 comprises the adaptive filter 102 for filtering the RF signal 104 and the controller 106 as already described in detail above. In contrast to FIG. 5, the switchable filter element 112_n can comprise an active filter unit 130 switchable between a primarily (or predominantly) capacitive state and a primarily (or predominantly) resistive state, wherein the active filter unit 130 can be configured to be in the primarily capacitive state in response to the active state of the switchable filter element 112_n and to be in the primarily resistive state in response to the deactivated state of the switchable filter element 112_n.

For example, the active filter unit 130 can be a field effect transistor. According to some embodiments, a switched off (high impedance state) transistor provides a capacitance between source and drain. Hence, the electrostatic sensitive capacitors shown in FIG. 5 can be exchanged by field effect transistors. In other words, no electrostatic sensitive MIM capacitors (MIM=metal isolator metal) are required if field effect transistors are used as filter units. Moreover, "big" field effect transistors may be required for obtaining the required capacitances. Nevertheless, "big" field effect transistors have an electrostatic self-protection function due to parasitic NPN transistors (p-bulk, n-channel). Typically, a thin MIM capacitor is able to withstand pulses of 30 to 40 V due to the thin dielectric, whereas "big" field effect transistors are able to withstand pulses of 1 to 2 kV.

As shown in FIG. 8, in some embodiments, the at least one switchable filter element 112_n can comprise a plurality of active filter units 130_1 to 130_k, wherein k is a natural number greater than or equal to two (k≥2), and wherein each active filter unit of the plurality of active filter units 130_1 to 130_k is switchable between a primarily capacitive state and a primarily resistive state. Thereby, the controller 106 can be configured to selectively activate the at least one switchable filter element 112_n by selectively switching a defined number of the plurality of active filter units 130_1 to 130_k from the primarily resistive state into the primarily capacitive state such that the at least one switchable filter element 112_n comprises a defined capacitance defined by the capacitances of the active filter units switched into the primarily capacitive state.

In some embodiments, the at least one switchable filter element 112_n can comprise a capacitor 132 and the plurality of active filter units 130_1 to 130_k connected in series.

Furthermore, the mobile communication device 100 can further comprise a RF switch 150 having a plurality of RF switch paths 152_1 to 152_u and a RF switch logic 107 for selectively switching at least one of a plurality of RF ports 154_1 to 154_u by means of the plurality of RF switch paths 152_1 to 152_u to an antenna 156 of the mobile communication device 100, wherein the controller 106 is implemented in the RF switch logic 107. Thereby, u is a natural number greater than or equal to two (u≥2).

Moreover, the mobile communication device 100 can further comprise a RF power amplifier 140, wherein the adaptive filter 102 is connected in series between the RF power amplifier 140 and one of the plurality of RF ports 154_1 to 154_u.

In other words, FIG. 8 shows a frontend module having an adaptive filter 102 and a RF switch logic 107, wherein the RF switch logic 107 is used to shift the filter centering of the adaptive filter 102 to the target frequency.

Figure 9A:
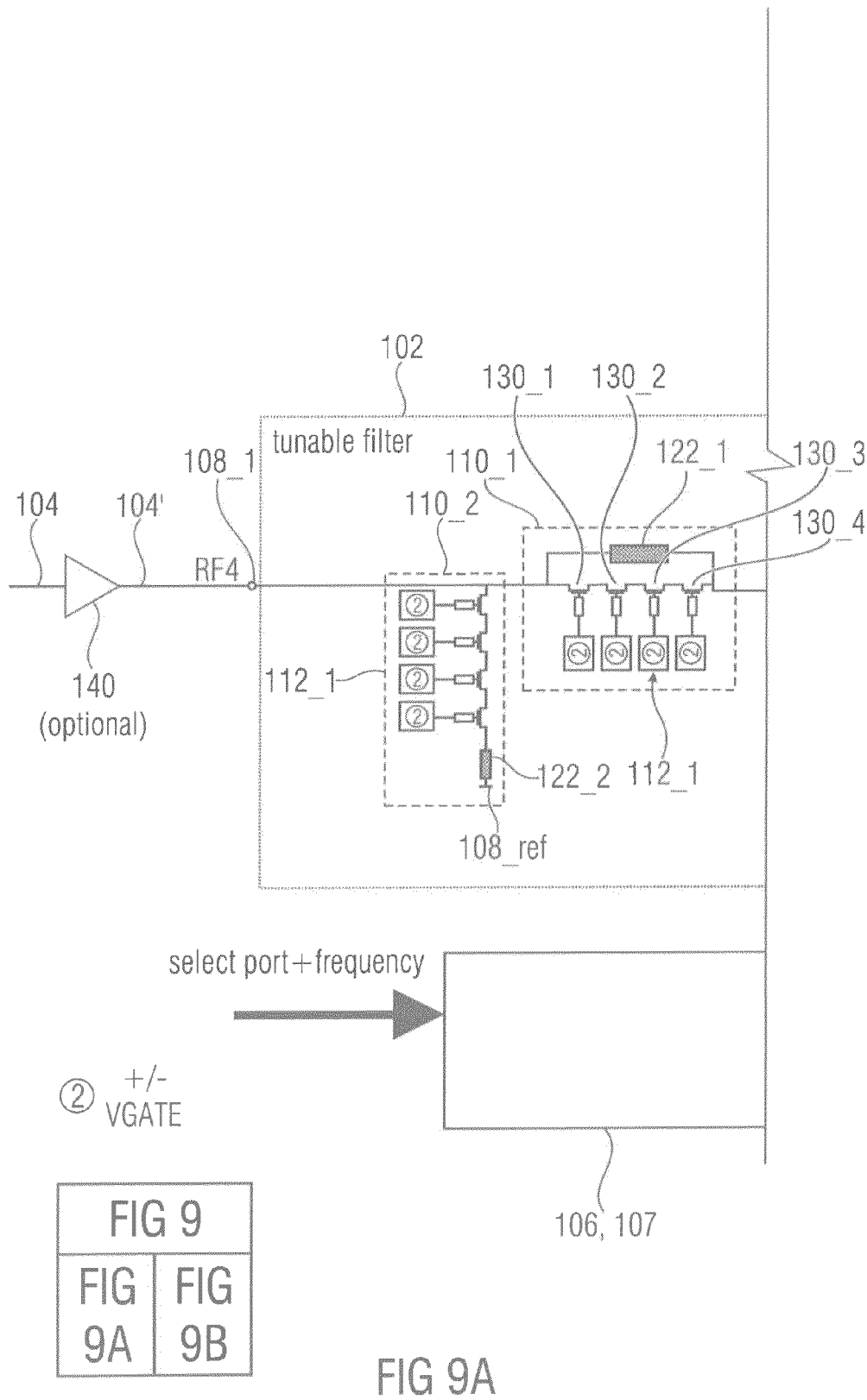
FIG. 9 shows a block diagram of a mobile communication device according to an embodiment.

FIG. 9 shows a block diagram of a mobile communication device 100 according to an embodiment. The mobile communication device 100 comprises the adaptive filter 102 for filtering the RF signal 104 and the controller 106 as already described in detail above. In contrast to FIG. 8, at least one filter structure of the first, second or third filter structures 110_1 to 110_3 comprises the at least one switchable filter element 112_n as the first, second or third capacitive element 120_1 to 120_3.

In other words, the adaptive filter comprises a first terminal 108_1, a second terminal 108_2, a reference terminal 108_ref (e.g., ground terminal) configured to provide a reference potential (e.g., ground potential), a first filter structure 110_1 connected in series between the first terminal 108_1 and the second terminal 108_2, a second filter structure 110_2 connected in series between the first terminal 104_1 and the reference terminal 108_ref, and a third filter structure 110_3 connected in series between the second terminal 108_2 and the reference terminal 108_ref. Thereby, the first filter structure 110_1 comprises a switchable filter element 112_n and a first inductor 122_1 connected in parallel, wherein the second filter structure 110_2 comprises a switchable filter element 112_n and the second inductor 122_2 connected in parallel, and wherein the third filter structure 110_3 comprises a switchable filter element 112_n and the third inductor 122_3 connected in series.

As already mentioned, in some embodiments, the switchable filter element 112_n can comprise a plurality of active filter units 130_1 to 130_k, wherein each active filter unit of the plurality of active filter units 130_1 to 130_k is switchable between a primarily capacitive state and a primarily resistive state. Thereby, the controller 106 can be configured to selectively activate the switchable filter element by selectively switching a defined number of the plurality of active filter units 130_1 to 130_k from the primarily resistive state into the primarily capacitive state such that the switchable filter element comprises a defined capacitance defined by the number of active filter units 130_1 to 130_k switched into the primarily capacitive state.

As shown in FIG. E, the switchable filter element 112_n can comprise the plurality of active filter units 130_1 to 130_k connected in series.

In some embodiments, the mobile communication device 100 can further comprises a power amplifier 140 configured to amplify the RF signal 104 in order to obtain an amplified RF signal 104', wherein the adaptive filter 102 can be configured to filter the amplified RF signal 104', and wherein the controller 106 can be configured to selectively deactivate the at least one switchable filter element 112_n if an power output of the power amplifier is smaller than 30% (or 50%, 40%, 20%, 10%, 7%, 5%, 3%, 1% or 0.5%) of a maximum possible power output of the power amplifier.

As shown in FIG. 9, it is possible to bypass the adaptive filter 102 by switching the field effect transistors (active filter units) 130_1 to 130_k (e.g., of the first filter structure 110_1) into the low impedance state thereby obtaining a bypass. In case of low power output of the power amplifier 140, it is possible to omit the filtering of the RF signal by the adaptive filter 102 since the harmonic products are reduced or even substantially smaller (e.g., gradient 2 or 3 for the third harmonic). This leads to a further reduction of insertion losses and hence to a further reduction of generated power output and hence to a reduction of power consumption in the system. Naturally, in that case, the adaptive filter 102 can be placed between the antenna 156 and the RF switch path paths 154_1 to 154_u as shown in FIG. 10, which may lead to a reduction in size but to an increase of insertion losses since the adaptive filter is always located within the RF path.

Figure 10:
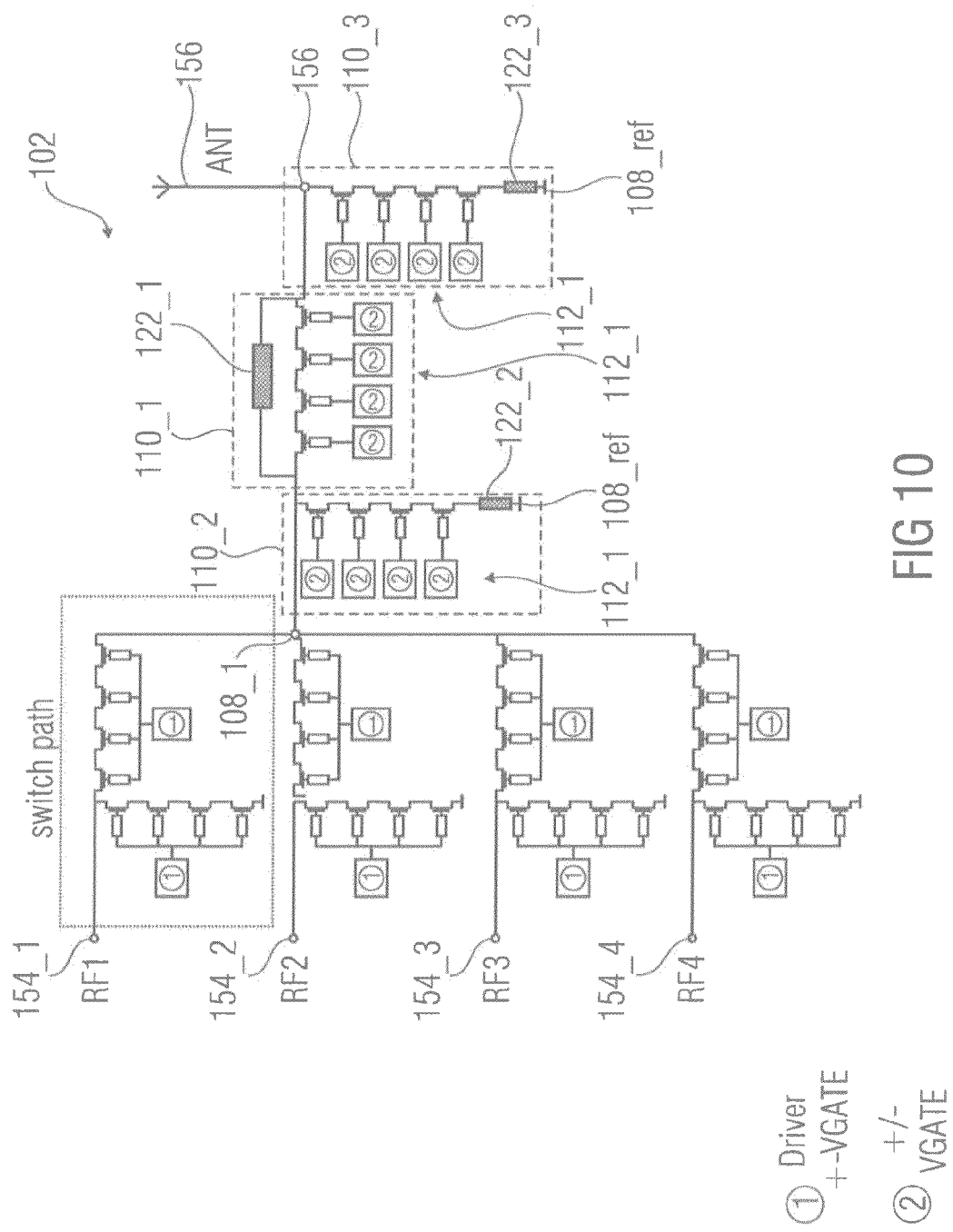
FIG. 10 shows a block diagram of a mobile communication device according to an embodiment.

FIG. 10 shows a block diagram of a mobile communication device 100 according to an embodiment. In contrast to FIG. 9, the adaptive filter 102 is connected in series between the plurality of RF switch paths 154_1 to 154_u and the antenna 156 of the mobile communication device 100.

As already mentioned, in some embodiments, the RF switch logic can be configured to selectively activate or deactivate the at least one switchable filter element 112_n based on an information received from a base band processor, for example, by means of SPI and/or RFFE (MIPI) bus. Note that on the SPI and/or RFFE (MIPI) bus telegrams (e.g., digital control signals) may present, that are originally intended for other devices, such as telegrams having control information for the power amplifier or an antenna adaption circuit. Thus, according to some embodiments, the RF switch logic can be configured to selectively activate or deactivate the at least one switchable filter element 112_n also based on those telegrams. For example, a telegram intended for the antenna adaption circuit can be used since it may comprise frequency dependent information, e.g., since the Ls/Cs are also frequency dependent. Moreover, such an adaption circuit may be implemented also in the same chip since the adaption circuit also can be seen as an adaptive filter (e.g., referring to FIG. 10). Furthermore, it would also possible to link or couple the adaptive filter and the antenna adaption circuit.

Figure 11:
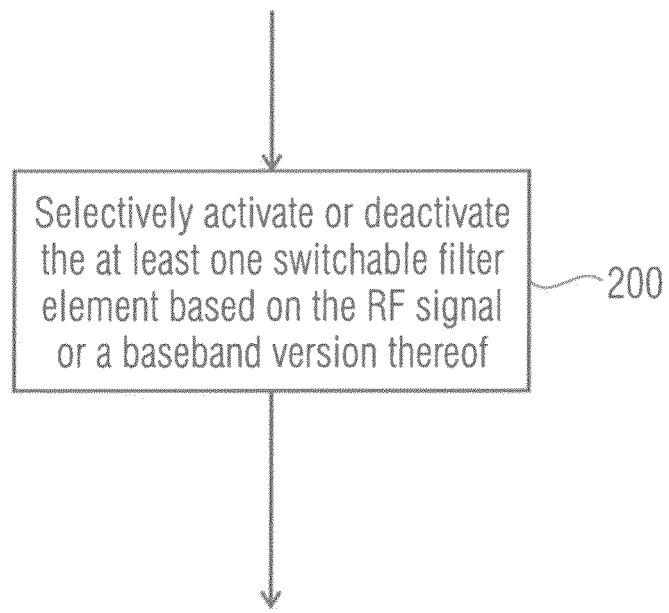
FIG. 11 shows a flow chart of a method for adaptive filtering a RF signal in a mobile communication device with an adaptive according to an embodiment.

FIG. 11 shows a flow chart of a method for filtering a RF signal in a mobile communication device with an adaptive filter according to an embodiment. The adaptive filter comprises a first terminal, a second terminal, a reference terminal configured to provide a reference potential, a first filter structure connected in series between the first terminal and the second terminal, a second filter structure connected in series between the first terminal and the reference terminal, and a third filter structure connected in series between the second terminal and the reference terminal, wherein at least one of the first, second and third filter structures comprises at least one switchable filter element. The method comprise the step 200 of selectively activating or deactivating the at least one switchable filter element based on the RF signal or a baseband version thereof.

In some embodiments, the at least one switchable filter element can comprise a plurality of active filter units, wherein each active filter unit is switchable between a primarily capacitive state and a primarily resistive state. Thereby, the method can comprise the step of selectively activating the at least one switchable filter element by selectively switching a defined number of the plurality of active filter units from the primarily resistive state into the primarily capacitive state such that the switchable filter element comprises a defined capacitance.

In some embodiments, the method can comprise the step of selectively deactivating the at least one switchable filter element if a power output of a power amplifier of the mobile communication device is smaller than 30% of a maximum possible power output of the power amplifier.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A mobile communication device, comprising:
an adaptive filter configured to filter an RF signal, wherein the adaptive filter comprises a first terminal, a second terminal, a reference terminal for providing a reference potential, a first filter structure connected in series between the first terminal and the second terminal, a second filter structure connected in series between the first terminal and the reference terminal, and a third filter structure connected in series between the second terminal and the reference terminal, wherein at least one of the first, second and third filter structures comprises at least one switchable filter element; and
a controller configured to selectively activate or deactivate the at least one switchable filter element based on the RF signal or a baseband version thereof in order to shift a notch of a second harmonic in its frequency such that a frequency at which a suppression of harmonics comprises its maximum value is selectable.

2. The mobile communication device according to claim 1, wherein the at least one switchable filter element is configured to provide a first capacitance in an activated state and a second capacitance different from the first capacitance in a deactivated state.

3. The mobile communication device according to claim 1, wherein the at least one switchable filter element comprises an active filter unit switchable between a primarily capacitive state and a primarily resistive state, wherein the active filter unit is configured to be in the primarily capacitive state in response to an active state of the switchable filter element and to be in the primarily resistive state in response to a deactivated state of the switchable filter element.

4. The mobile communication device according to claim 3, wherein the active filter unit is a field effect transistor.

5. The mobile communication device according to claim 1, wherein the at least one switchable filter element comprises a plurality of active filter units, wherein each active filter unit of the plurality of active filter units is switchable between a primarily capacitive state and a primarily resistive state; and
wherein the controller is configured to selectively activate the switchable filter element by selectively switching a defined number of the plurality of active filter units from the primarily resistive state into the primarily capacitive state such that the switchable filter element comprises a defined capacitance.

6. The mobile communication device according to claim 5, wherein the at least one switchable filter element comprises a capacitor and the plurality of active filter units connected in series.

7. The mobile communication device according to claim 5, wherein the mobile communication device further comprises a power amplifier configured to amplify the RF signal in order to obtain an amplified RF signal, wherein the adaptive filter is configured to filter the amplified RF signal, and wherein the controller is configured to selectively deactivate the at least one switchable filter element if an power output of the power amplifier is smaller than 30% of a maximum possible power output of the power amplifier.

8. The mobile communication device according to claim 1, wherein the at least one switchable filter element comprises a passive filter unit switchable between a capacitive state and a non-capacitive state, wherein the passive filter unit is configured to be in the capacitive state in response to an activated state of the switchable filter element and to be in the non-capacitive state in response to a deactivated state of the switchable filter element.

9. The mobile communication device according to claim 8, wherein the passive filter unit is a switchable capacitor.

10. The mobile communication device according to claim 1, wherein the first filter structure comprises a first capacitive element and a first inductive element connected in parallel, wherein the second filter structure comprises a second capacitive element and a second inductive element connected in series, and wherein the third filter structure comprises a third capacitive element and a third inductive element connected in series; and
wherein at least one of the first, second and third filter structures comprises the at least one switchable filter element such that the at least one switchable filter element is connected in parallel to at least one of the first, second and third capacitive elements.

11. The mobile communication device according to claim 1, wherein the first filter structure comprises a first capacitive element and a first inductive element connected in parallel, wherein the second filter structure comprises a second capacitive element and a second inductive element connected in series, and wherein the third filter structure comprises a third capacitive element and a third inductive element connected in series; and
wherein at least one of the first, second or third filter structure comprises the at least one switchable filter element as the first, second or third capacitive element.

12. The mobile communication device according to claim 1, wherein each filter structure of the first, second and third filter structures comprises at least one switchable filter element.

13. The mobile communication device according to claim 1, wherein the mobile communication device further comprises a RF switch comprising a RF switch logic and a plurality of RF switch paths having a plurality of RF switch ports, wherein the RF switch logic is configured for selectively switching at least one of the plurality of RF switch ports by means of the plurality of RF switch paths to an antenna of the mobile communication device, and wherein the controller is implemented in the RF switch logic.

14. The mobile communication device according to claim 13, wherein the mobile communication device further comprises a RF power amplifier, wherein the adaptive filter is connected in series between the RF power amplifier and one of the plurality of RF ports.

15. The mobile communication device according to claim 13, wherein the adaptive filter is connected in series between the plurality of RF switch paths and the antenna of the mobile communication device.

16. A mobile communication device, comprising:
an adaptive filter for filtering a RF signal, wherein the adaptive filter comprises a first terminal, a second terminal, a reference terminal for providing a reference potential, a first filter structure connected in series between the first terminal and the second terminal, a second filter structure connected in series between the first terminal and the reference terminal, and a third filter structure connected in series between the second terminal and the reference terminal, wherein each filter structure of the first, second and third filter structures comprises at least one switchable filter element; and
a RF switch comprising a RF switch logic and a plurality of RF switch paths having a plurality of RF switch ports, wherein the adaptive filter is connected to one of the plurality of RF switch paths;
wherein the RF switch logic is configured for selectively switching at least one of the plurality of RF switch ports by means of the plurality of RF switch paths to an antenna of the mobile communication device and to selectively activate or deactivate the at least one switchable filter element of the first, second and third filter structures based on the RF signal or a baseband version thereof in order to shift a notch of a second harmonic in its frequency such that a frequency at which a suppression of harmonics comprises its maximum value is selectable.

17. The mobile communication device according to claim 16, wherein the at least one switchable filter element is configured to provide a first capacitance in an activated state and a second capacitance different from the first capacitance in a deactivated state.

18. The mobile communication device according to claim 16, wherein the at least one switchable filter element comprises an active filter unit switchable between a primarily capacitive state and a primarily resistive state, wherein the active filter unit is configured to be in the primarily capacitive state in response to the active state of the switchable filter element and to be in the primarily resistive state in response to a deactivated state of the switchable filter element.

19. The mobile communication device according to claim 16, wherein the at least one switchable filter element comprises a plurality of active filter units, wherein each active filter unit of the plurality of active filter units is switchable between a primarily capacitive state and a primarily resistive state; and
wherein the mobile communication device further comprises a controller that is configured to selectively activate the switchable filter element by selectively switching a defined number of the plurality of active filter units from the primarily resistive state into the primarily capacitive state such that the at least one switchable filter element comprises a defined capacitance.

20. A method for adaptive filtering a RF signal in a mobile communication device with an adaptive filter, wherein the adaptive filter comprises a first terminal, a second terminal, a reference terminal for providing a reference potential, a first filter structure connected in series between the first terminal and the second terminal, a second filter structure connected in series between the first terminal and the reference terminal, and a third filter structure connected in series between the second terminal and the reference terminal, wherein at least one of the first, second and third filter structures comprises at least one switchable filter element, wherein the method comprises:

selectively activating or deactivating the at least one switchable filter element based on the RF signal or a baseband version thereof in order to shift a notch of the second harmonic in its frequency such that a frequency at which a suppression comprises its maximum value is selectable.

21. The method according to claim 20, wherein the at least one switchable filter element comprises a plurality of active filter units, wherein each active filter unit of the plurality of active filter units is switchable between a primarily capacitive state and a primarily resistive state, wherein the method further comprises:

selectively activating the at least one switchable filter element by selectively switching a defined number of the plurality of active filter units from the primarily resistive state into the primarily capacitive state such that the switchable filter element comprises a defined capacitance.

22. The method according to claim 21, further comprising selectively deactivating the at least one switchable filter element if a power output of a power amplifier of the mobile communication device is smaller than 30% of a maximum possible power output of the power amplifier.

* * * * *